(12) United States Patent
Yamazaki et al.

(10) Patent No.: US 8,134,839 B2
(45) Date of Patent: Mar. 13, 2012

(54) JUNCTION STRUCTURE OF SUBSTRATE AND JOINING METHOD THEREOF

(75) Inventors: Masahiro Yamazaki, Osaka (JP); Yasumasa Shibata, Osaka (JP); Yasuo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 280 days.

(21) Appl. No.: 12/506,598

(22) Filed: Jul. 21, 2009

(65) Prior Publication Data

US 2010/0021756 A1    Jan. 28, 2010

(30) Foreign Application Priority Data

Jul. 22, 2008    (JP) ................................. 2008-188109
Jul. 15, 2009    (JP) ................................. 2009-166213

(51) Int. Cl.
    *H05K 1/00*      (2006.01)

(52) U.S. Cl. ........ 361/749; 361/743; 361/784; 361/785; 361/789; 174/254; 174/255; 439/65; 439/67

(58) Field of Classification Search ................ 174/73.1, 174/74 R, 75 R, 75 F, 355, 254, 255, 260; 361/749, 743, 784, 785, 789; 439/55, 65, 439/67

See application file for complete search history.

(56) References Cited

U.S. PATENT DOCUMENTS

| | | | | |
|---|---|---|---|---|
| 4,113,981 | A * | 9/1978 | Fujita et al. | 174/88 R |
| 5,018,005 | A * | 5/1991 | Lin et al. | 257/730 |
| 5,428,190 | A * | 6/1995 | Stopperan | 174/261 |
| 5,452,182 | A * | 9/1995 | Eichelberger et al. | 361/749 |
| 6,201,689 | B1 * | 3/2001 | Miyasyo | 361/679.54 |
| 6,208,521 | B1 * | 3/2001 | Nakatsuka | 361/749 |
| 6,384,339 | B1 * | 5/2002 | Neuman | 174/254 |
| 6,469,255 | B2 * | 10/2002 | Watanabe et al. | 174/254 |
| 6,531,662 | B1 * | 3/2003 | Nakamura | 174/255 |
| 6,879,465 | B2 * | 4/2005 | Tsuchiya et al. | 360/245.4 |
| 7,223,921 | B2 * | 5/2007 | Rissing et al. | 174/254 |
| 7,250,575 | B2 * | 7/2007 | Nagao et al. | 174/254 |
| 7,484,967 | B2 * | 2/2009 | Ichino et al. | 439/67 |
| 7,606,041 | B2 * | 10/2009 | Park | 361/749 |

FOREIGN PATENT DOCUMENTS

| | | |
|---|---|---|
| JP | 01/248687 | 10/1989 |
| JP | 09-320092 | 12/1997 |

* cited by examiner

*Primary Examiner* — Cathy Lam
(74) *Attorney, Agent, or Firm* — Hamre, Schumann, Mueller & Larson, P.C.

(57) ABSTRACT

A junction structure and a joining method of substrates are provided that stably can join the substrates and achieve high workability during joining. A second substrate 2 to be joined with solder to a first substrate 1 is bent with elasticity generated by a bending portion 9, and first joints 5 on the first substrate 1 and second joints 6 on the second substrate 2 are joined with solder in a state in which the first substrate 1 is brought into contact with, in a direction that increases the bending angle of the bending portion 9, a part where the joints 6 are formed on the second substrate 2.

10 Claims, 7 Drawing Sheets

PRIOR ART

FIG. 6

PRIOR ART

FIG. 7
PRIOR ART

JUNCTION STRUCTURE OF SUBSTRATE AND JOINING METHOD THEREOF

REFERENCE TO RELATED APPLICATIONS

The disclosures of Japanese Patent Application No. 2008-188109 filed Jul. 22, 2008 and Japanese Patent Application No. 2009-166213 filed Jul. 15, 2009 including specification, drawings and claims are incorporated herein by reference in its entirety.

FIELD OF THE INVENTION

The present invention relates to a junction structure of a plurality of substrates joined with a joining material such as solder, and a method of joining the substrates.

BACKGROUND OF THE INVENTION

When a plurality of substrates are joined with solder, it is necessary to consider the reliability and workability during and after the joining of the substrates. The following will describe a junction structure of substrates according to the prior art.

Figure 5:
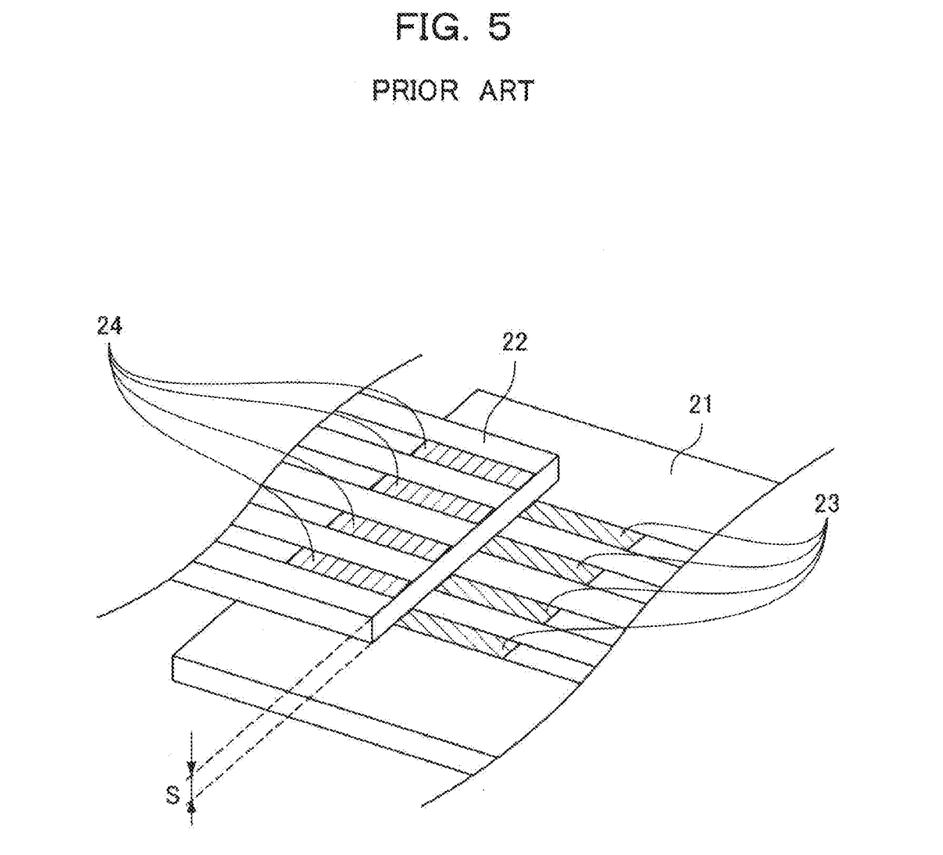
FIG. 5 is a perspective view showing a junction structure of substrates according to a first prior art example.

FIG. 5 shows a first prior art example as a junction structure of substrates according to the prior art. Reference numeral 21 denotes a first substrate, reference numeral 22 denotes a second substrate, reference numeral 23 denotes the metal foil portions of the first substrate 21, and reference numeral 24 denotes the metal foil portions of the second substrate 22. The first substrate 21 and the second substrate 22 are arranged in parallel, the metal foil portions 24 of the second substrate 22 are overlapped on the metal foil portions 23 of the first substrate 21, and solder joints are formed thereon.

Figure 6:
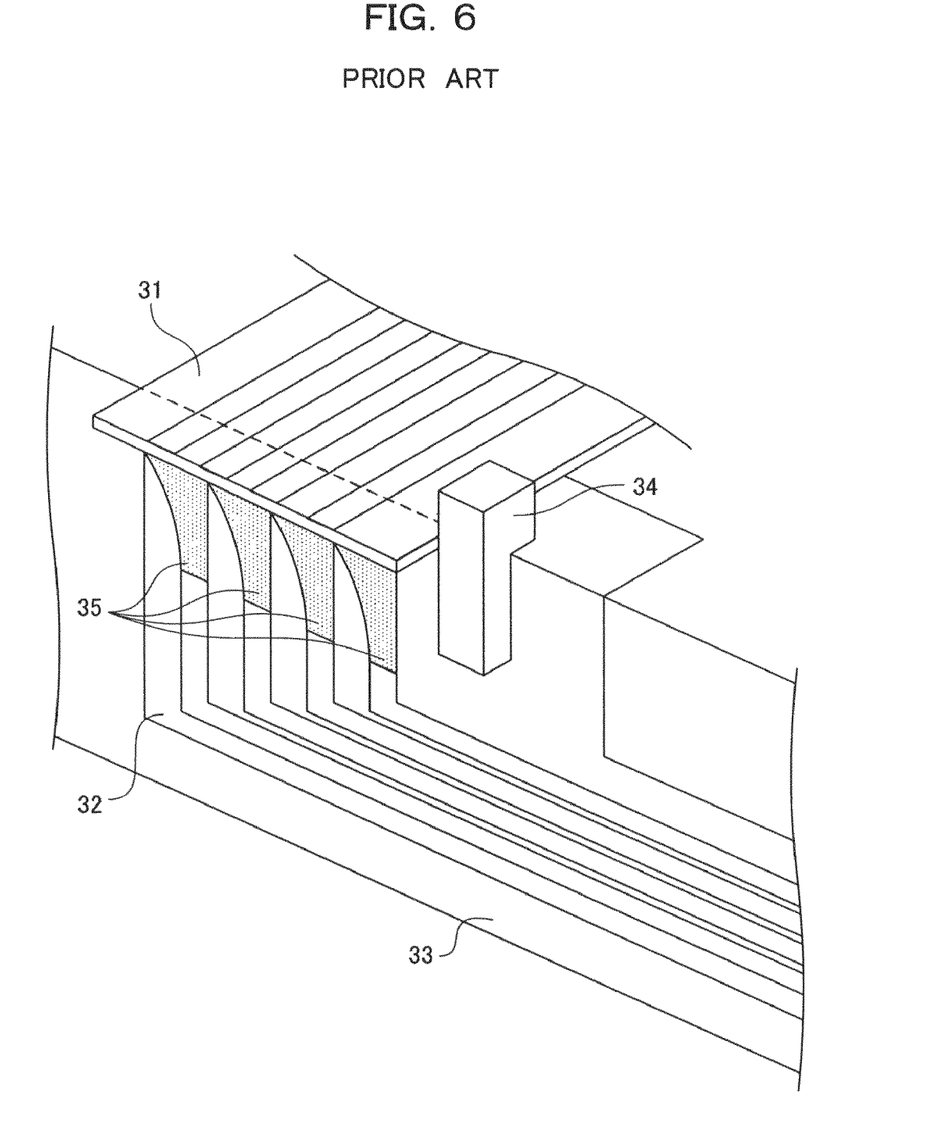
FIG. 6 is a perspective view showing a junction structure of substrates according to a second prior art example.

A second prior art example as a junction structure of substrates according to the prior art is disclosed in Japanese Patent Laid-Open No. 9-320092. FIG. 6 shows the junction structure. In FIG. 6, reference numeral 31 denotes a first flexible substrate, reference numeral 32 denotes a second flexible substrate, reference numeral 33 denotes a holding member (optical base) for holding the second flexible substrate 32, reference numeral 34 denotes a positioning protrusion for positioning the holding member 33, and reference numeral 35 denotes solder applied to the copper foil portions of the second flexible substrate 32. The first flexible substrate 31 and the second flexible substrate 32 are caused to cross each other at substantially right angles and are joined with solder.

Figure 7:
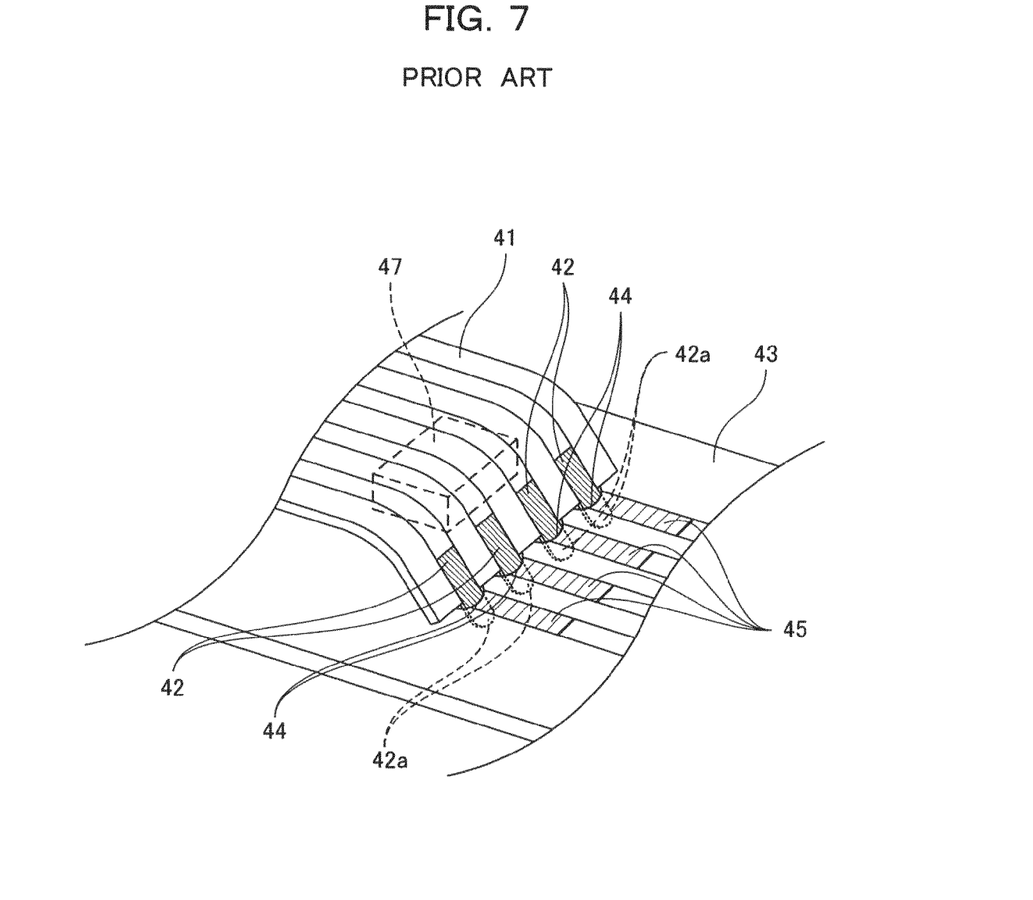
FIG. 7 is a perspective view showing a junction structure of substrates according to a third prior art example.

A third prior art example as a junction structure of substrates according to the prior art is disclosed in Japanese Patent Laid-Open No. 1-248687. FIG. 7 shows the junction structure. In FIG. 7, reference numeral 41 denotes a first flexible printed circuit board having comb-teeth portions 42a formed on the ends of metal-foil exposed portions 42 provided on the end of the first flexible printed circuit board 41. Reference numeral 43 denotes a second flexible printed circuit board having holes 44 formed next to metal-foil exposed portions 45 of the second flexible printed circuit board 43 such that the comb-teeth portions 42a can be inserted into the holes 44. During joining, the comb-tooth portions 42a are inserted into the holes 44 and then soldering is performed. Further, at least one electrical component 47 is mounted so as to be hidden under the first flexible printed circuit board 41 and the angle of insertion into the holes 44 is regulated according to the height of the electrical component 47.

DISCLOSURE OF THE INVENTION

However, the foregoing prior art examples have the following problems:

In the first prior art example, as shown in FIG. 5, the first substrate 21 and the second substrate 22 are arranged in parallel and the metal foil portions 24 of the second substrate 22 simply are overlapped on the metal foil portions 23 of the first substrate 21. Thus during joining, the relative positions of the metal foil portions 23 of the first substrate 21 and the metal foil portions 24 of the second substrate 22 may be displaced from each other, resulting in unstable positioning. Moreover, since there is a height difference S between the overlapping first substrate 21 and second substrate 22, the influence of the surface tension of solder melted during joining makes it difficult to apply the solder over the step height to the ends of the substrates 21 and 22, causing poor workability during joining.

In the second prior art example, the second flexible substrate 32 is held while being positioned by the holding member 33 and the positioning protrusion 34. The first flexible substrate 31 is not held by a holding member and is unstably positioned. Thus when the edge of an iron comes into contact with the first flexible substrate 31 during working, the first flexible substrate 31 moves away from the second flexible substrate 32 (upward in FIG. 6) and the solder falls off. Further, since the joints are orthogonal to each other, it is difficult for a soldering worker visually to check the joints from above. Moreover, when a soldering iron having a thick end is brought into contact with intersection points corresponding to the joints, it is difficult to apply heat near the contacts of the flexible substrates 31 and 32 simultaneously, thereby considerably reducing workability during joining.

In the third prior art example, the ends of the metal-foil exposed portions 42 of the first flexible printed circuit board 41 have to be worked into comb-teeth portions. Further, it is necessary to form the holes 44 of the second flexible printed circuit board 43 with high accuracy such that the comb-teeth portions 42a on the end of the first flexible printed circuit board 41 can be inserted into the holes 44 satisfactorily. Thus the degree of difficulty in working the flexible printed circuit boards 41 and 42 increases and causes a higher price. Moreover, it is necessary to mount the electrical component 47 on the back side of the first flexible printed circuit board 41, eliminating flexibility in the wiring designs of the flexible printed circuit boards 41 and 43.

The present invention has been devised to solve the problems of the prior art. An object of the present invention is to provide a junction structure of substrates and a joining method thereof which can further stabilize joining with a joining material such as solder and achieve high workability during joining.

In order to solve the problems of the prior art, in the junction structure of substrates according to the present invention, a first joint formed on one end of the first substrate and a second joint formed on the second substrate are joined with a joining material. The second substrate is bent and exhibits an elastic force generated in a direction that reduces the degree of bending. The second joint is formed on a surface of the second substrate, the elastic force being directed to the surface. In the junction structure, the one end of the first substrate contacts the second substrate so as to resist the elastic force generated by bending the second substrate. The first joint and second joint are joined with the joining material.

A junction structure of substrates according to the present invention, has a first joint formed on one end of the first substrate and a second joint formed on the second substrate having elasticity are soldered, wherein the second substrate is bent and exhibits elasticity by a bending portion and has the second joints directed outward on the second substrate, and the first joint and the second joint are joined with solder in a state in which the one end of the first substrate is brought into contact with, in a direction that increases the bending angle of the bending portion, a part where the second joints are formed on the second substrate.

A method of joining substrates according to the present invention, in which a first joint formed on one end of the first substrate and a second joint formed on the second substrate having elasticity are joined with solder, includes the steps of: bending a part where the second joint is formed on the second substrate, by a bending portion in a state in which the part where the second joint is formed is directed outward; bringing the one end of the first substrate into contact with the part where the second joint is formed on the second substrate, with a pressure applied in a direction that increases the bending angle of the bending portion; and joining with solder the second joint on the second substrate and the first joint on the first substrate brought into contact with the second joint.

In the junction structure of the substrates and the joining method thereof according to the present invention, the one end of the first substrate is brought into contact with the second substrate so as to resist an elastic force generated by bending the second substrate. Thus even when the first joints and the second joints are joined with the joining material, the second substrate is urged in a direction along which the first joints and the second joints are in contact with each other, thereby suppressing separation of the joints. It is therefore possible to join the substrates with the joining material more stably.

DESCRIPTION OF THE EMBODIMENT

The following will describe an embodiment with reference to the accompanying drawings.

Figure 1:
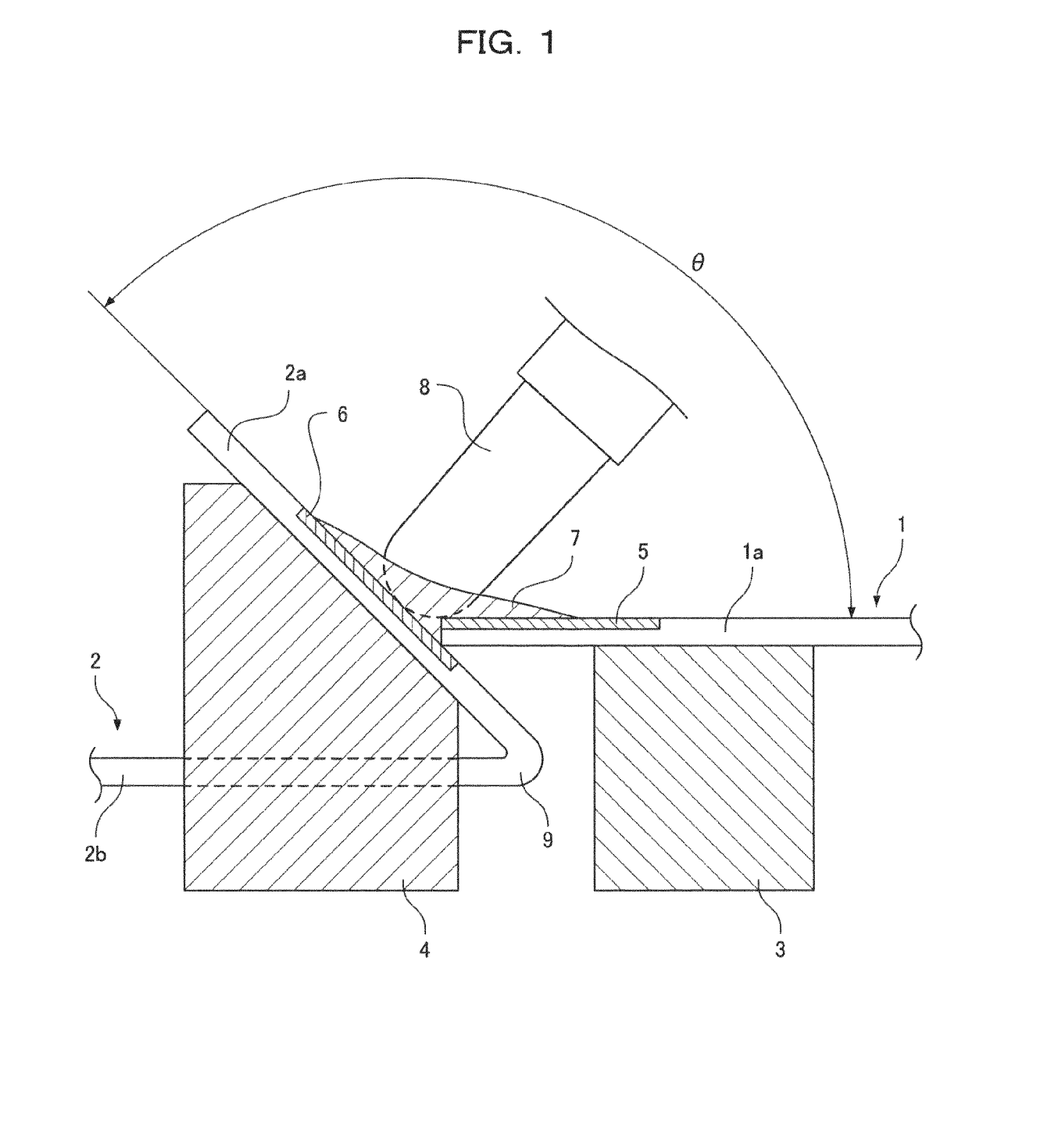
FIG. 1 is a side view showing a junction structure of substrates according to an embodiment.
Figure 2:
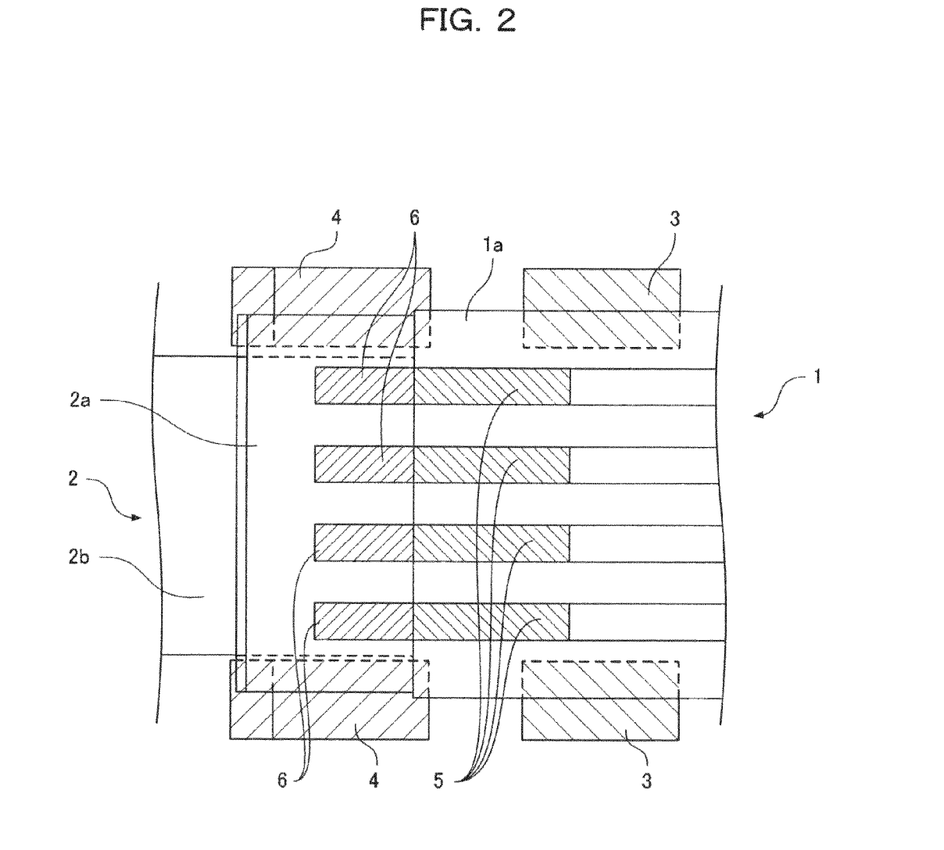
FIG. 2 is a plan view showing the junction structure of the substrates according to the embodiment.
Figure 3:
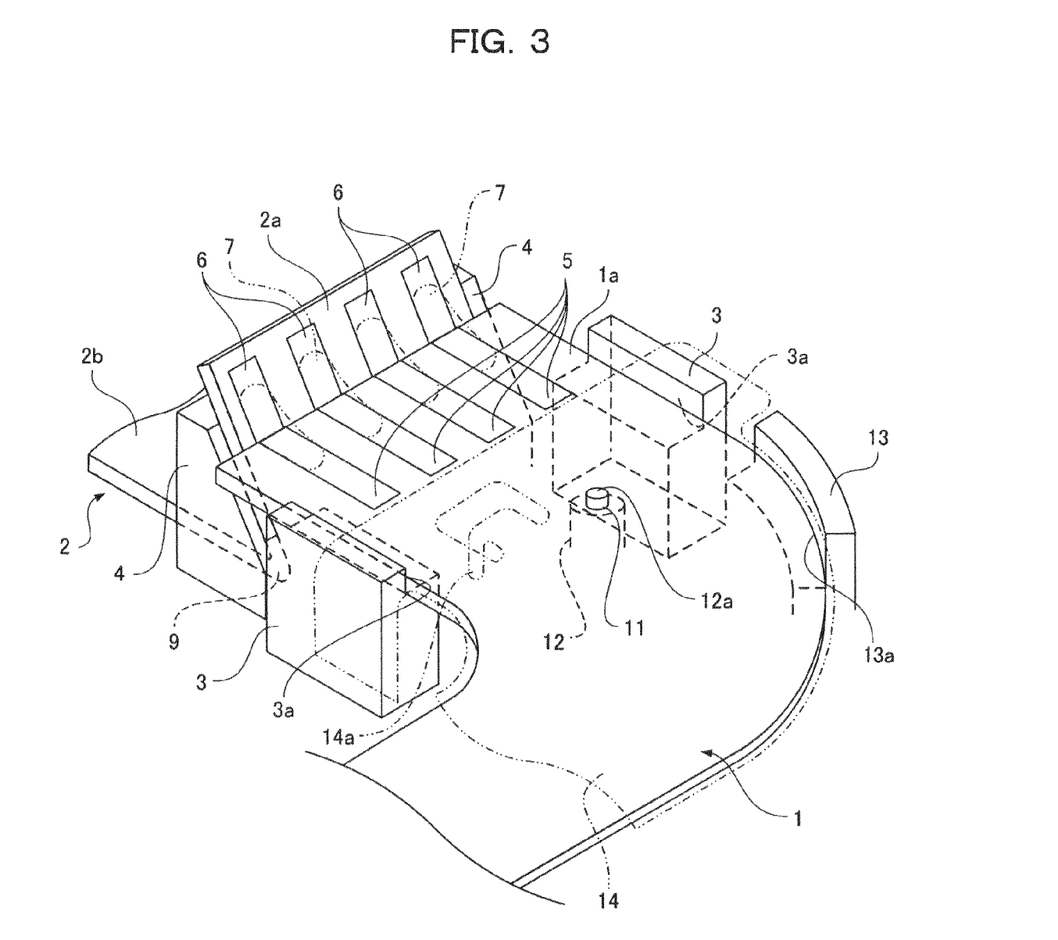
FIG. 3 is a perspective view showing the junction structure of the substrates according to the embodiment.

In FIGS. 1 to 3, reference numeral 1 denotes a first substrate made up of a first flexible printed circuit board and reference numeral 2 denotes a second substrate made up of a second flexible printed circuit board having elasticity (flexibility). On an end 1a of the first substrate 1, first joints 5 are formed, which are made of metal exposed portions of copper foil and the like. On the second substrate 2, second joints 6 made of metal exposed portions of copper foil and the like are formed on a surface facing the first joints 5. The first joints 5 and the second joints 6 are joined with solder 7 (the solder 7 is not shown in FIG. 2). In this embodiment, the first joints 5 and the second joints 6 are provided on four points on the substrates 1 and 2, respectively. The present invention is not limited to this configuration. The first joints 5 and the second joints 6 may be made of any material (metal) as long as conductivity and solderability are obtained. Thus the material of the joints is not limited to copper foil. As shown in FIGS. 2 and 3, a part where the second joints 6 are formed on the second substrate 2 simply is formed into a planar shape and holes are not formed, unlike in the second prior art example. Further, a part where the first joints 5 are formed on the first substrate 1 has an end simply formed into straight lines and comb-teeth portions are not formed, unlike in the second prior art example.

As shown in FIGS. 1 and 3, the second substrate 2 is bent with elasticity at a bending portion 9 and the second joints 6 (to be specific, a part 2a bent at the bending portion 9 and having the second joints 6 formed on the second substrate 2 (also referred to as a bent piece)) are directed outward. Further, the first substrate 1 (to be specific, the edge of the end 1a where the first joints 5 are formed on the first substrate 1) is brought into contact with the part where the second joints 6 are formed on the second substrate 2. In this state, the first joints 5 and the second joints 6 are joined with the solder 7. In FIG. 1, reference numeral 2b denotes a part serving as a base bent by the bending portion 9 on the second substrate 2 (the body of the second substrate 2).

Moreover, the first substrate 1, to be specific, the part where the first joints 5 are formed on the first substrate 1 (the end 1a) is held while being supported from below by a pair of first holding members 3 that are arranged laterally. The part (the bent piece) 2a containing the second joints 6 formed on the second substrate 2 is held while being supported obliquely from below by a pair of second holding members 4 are arranged laterally. The body 2b of the second substrate 2 is held by another holding member (will be referred to as a body holding member, not shown).

As shown in FIGS. 1 and 3, the first substrate 1 held by the first holding members 3 and the part (bent piece) 2a where the second joints 6 are provided on the second substrate 2 held by the second holding members 4 are joined so as to be opposed to each other at an obtuse angle (e.g., from 100° to 170°). In other words, on the bent piece 2a of the second substrate 2 bent by the bending portion 9, to be specific, on the second joints 6 of the bent piece 2a, the end 1a of the first substrate 1 is overlapped and is joined with the solder 7 at an obtuse angle (e.g. from 100° to 170°). The end 1a of the first substrate 1 is more preferably joined in contact with the second joints 6 at an angle θ of substantially 135°.

Further, as shown in FIGS. 1 to 3, the first holding members 3 are in contact with the first substrate 1 in regions other than the first joints 5 on the back side of the first substrate 1. The second holding members 4 are in contact with the second substrate 2 in regions other than the second joints 6 on the back side of the second substrate 2. In the present embodiment, side edges disposed outside the first joints 5 on the first substrate 1 relative to the width direction of the substrate are held by the laterally arranged first holding members 3 from the back side of the substrate. The present invention is not limited to this configuration. Moreover, side edges disposed outside the second joints 6 on the second substrate 2 relative to the width direction of the substrate are held by the laterally arranged second holding members 4 from the back side of the substrate. The present invention is not limited to this configuration.

In the present embodiment, as shown in FIG. 3, a hole 11 is formed on the first substrate 1 and the first substrate 1 is also held by a boss 12 having a protrusion 12a that protrudes and fits into the hole 11 of the first substrate 1. Further, on the first holding members 3 and an auxiliary holding member 13 disposed near the first holding member 3 to hold the first substrate 1, steps 3a and 13a are formed and the first substrate 1 is positioned in the horizontal direction (along the surface of the first substrate 1) by the protrusion 12a and the steps 3a and 13a of the first holding members 3 and the auxiliary holding member 13. Moreover, a cover member 14 (indicated by a chain double-dashed line in FIG. 3) is mounted over the first substrate 1. After the first substrate 1 is contacted by a push-down protrusion 14a formed on the cover member 14, the position of the first substrate 1 is regulated so as not to move upward.

Figure 4A:
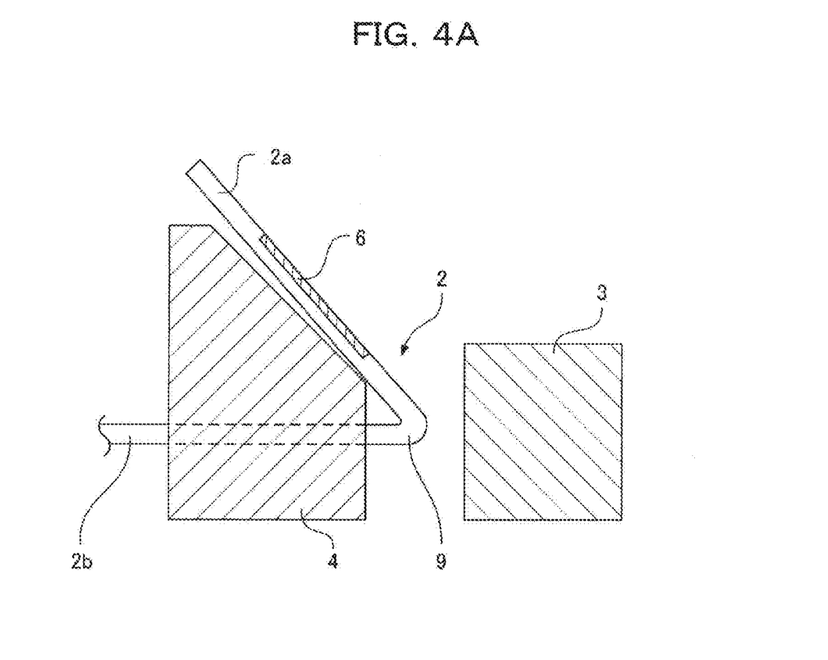
FIGS. 4A and 4B are side views showing the steps of joining the substrates according to the embodiment.

The first joints 5 of the first substrate 1 and the second joints 6 of the second substrate 2 are joined with the solder 7 as follows:

First, as shown in FIG. 4A, the part (bent piece 2a) where the second joints 6 are formed on the second substrate 2 is bent by the bending portion 9 such that the part where the second joints 6 are formed is directed outward (bending step). The second substrate 2 is held by the body holding member (not shown), which is provided separately. At this point, in the part (bent piece 2a) where the second joints 6 are formed on the second substrate 2, a restoring force for restoration to a state before bending is exhibited by the bending portion 9 due to the elastic force of the second substrate 2, and the part (bent piece 2a) is placed slightly above the second holding members 4 (with a gap between the part and the second holding members 4).

Figure 4B:
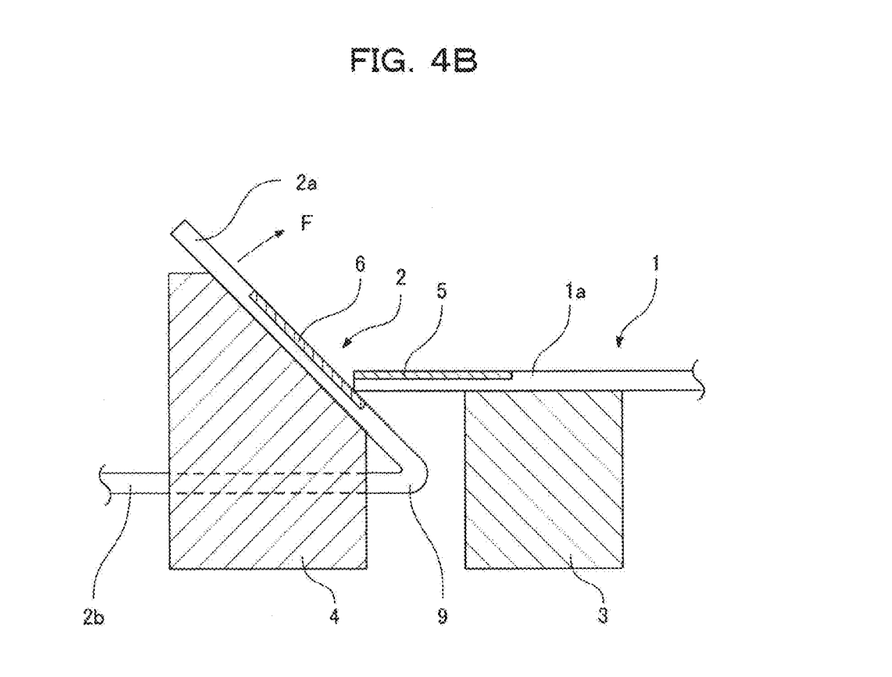

Next, the first substrate 1 is brought in from above and is mounted so as to be held by the first holding members 3, the auxiliary holding member 13, and the boss 12. At this point, as shown in FIG. 4B, the part (end) 1a where the first joints 5 are formed on the first substrate 1 is brought into contact with the part (bent piece 2a) where the second joints 6 are formed on the second substrate 2; meanwhile, the part (end) 1a is pressed in a direction (downward in the present embodiment, but the part la may be pressed to the left in FIG. 1 as long as the bending angle increases) that increases the bending angle of the bending portion 9 (contacting step).

After that, the second joints 6 on the second substrate 2 and the first joints 5 on the first substrate 1 brought into contact with the second joints 6 are joined with the solder 7 by using a soldering iron 8 (solder joining step).

According to the junction structure and the joining method of the substrates, the part (end) 1a where the first joints 5 are formed on the first substrate 1 is brought into contact with the part (bent piece) 2a containing the second joints 6 on the second substrate 2 in the direction that increases the bending angle of the bending portion 9. At this point, as shown in FIG. 4B, a restoring force F caused by an elastic force is generated so as to return in the opposite direction from the bending direction, so that the first joints 5 and the second joints 6 are in contact with each other while being urged by the restoring force F. Thus also when the first joints 5 and the second joints 6 are joined with solder, the first joints 5 and the second joints 6 are urged so as to come into contact with each other. It is therefore possible to minimize the possibility that the first joints 5 and the second joints 6 may be separated from each other, and soldering can be performed satisfactorily with stable positioning. Hence, it is possible to join the substrates more stably and with high workability during joining and reduce the exfoliation of solder, thereby joining the substrates 1 and 2 with quite high reliability.

When the first joints 5 of the first substrate 1 are pressed from above by the edge of the soldering iron 8 during the joining of the substrates 1 and 2, the first substrate 1 presses the second substrate 2 to the second holding members 4. Thus the substrates can be joined stably with solder without raising the second substrate 2 toward a solder joining worker. Moreover, even if only the second joints 6 of the second substrate 2 are pressed obliquely down to the second holding members 4 by the soldering iron 8 during the joining of the substrates 1 and 2, it is possible to minimize the possibility that the second joints 6 may be separated from the first joints 5 because the second joints 6 (bent piece 2a) are held by the second holding members 4. After that, the edge of the soldering iron 8 is separated from the second joints 6 (bent piece 2a), so that the second joints 6 (bent piece 2a) are returned to and brought into contact with the first joints 5 by the restoring force F. Also in this case, the substrates 1 and 2 can be joined with higher reliability.

According to the junction structure and the joining method, the first holding members 3 are in contact with the first substrate 1 in regions other than the first joints 5 on the back side of the first substrate 1, and the second holding members 4 are in contact with the second substrate 2 in regions other than the second joints 6 on the back side of the second substrate 2. Thus it is possible to apply heat from the soldering iron 8 to the joints 5 and 6 without releasing the heat to the holding members 3 and 4 during soldering, so that the substrates can be joined quickly with solder. In other words, when the holding members are provided in the regions of the joints on the back side of the substrate, heat from the soldering iron 8 during soldering easily is released from the holding members, so that heat has to be applied by the soldering iron 8 for long periods to join the substrates with solder, and thus the working efficiency may decrease. The present embodiment can prevent such problems and improve the working efficiency.

Moreover, according to the junction structure and the joining method, the first substrate 1 and the bent piece 2a of the second substrate 2 are opposed to each other at an obtuse angle (e.g., from 100° to 170°), that is, at an angle larger than 90°. Thus during joining, a solder joining worker can check the first joints 5 and the second joints 6 visually from above, easily insert the soldering iron 8 to the joints 5 and 6, and easily apply heat to the joints 5 and 6 and near these points at the same time, thereby achieving quite high workability.

Further, according to the junction structure and the joining method, the first joints 5 and the second joints 6 are disposed close to each other at an angle of 100° to 170°. Thus the steps are smaller than in the case where the substrates are simply stacked in parallel, and the molten solder 7 can be applied easily to the joints 5 and 6, thereby improving workability when the substrates are joined with solder. As has been discussed, when the first substrate 1 is a flexible printed circuit board, the first substrate 1 has a small thickness. Thus it is possible to reduce the steps of the first joints 5 and the second joints 6 considerably and apply the molten solder 7 to the joints 5 and 6 with great ease, thereby further improving the workability when the substrates are joined with solder.

Moreover, according to the junction structure and the joining method, the end face of the end 1a where the first joints 5 are provided on the first substrate 1 is simply formed into straight lines and the end 1a of the first substrate 1 is formed into a so-called rectangle. Thus unlike in the third prior art example, it is not necessary to work the end into comb-teeth portions or form holes on the end, so that the end can be worked easily and the price is not increased. Moreover, it is not necessary to mount electrical components for the arrangement of the joints on the substrates, so that the wiring designs of the substrates 1 and 2 remain flexible.

In the foregoing configuration, the first substrate 1 is a flexible printed circuit board having elasticity. In this case, as has been discussed, the steps of the first joints 5 and the second joints 6 are reduced and the molten solder 7 easily is applied to the joints 5 and 6. However, the present invention is not limited to this kind of substrate and a hard substrate made of an epoxy material and the like may be used. The second substrate 2 may be made of any material as long as elasticity is exhibited with a restoring force. A flexible printed circuit board preferably is used but the present invention is not limited to this kind of substrate.

Further, in the foregoing embodiment, the first substrate 1 and the second substrate 2 are flexible printed circuit boards. On points where the first joints 5 and the second joints 6 are provided, the flexible printed circuit boards are singly used. The present invention is not limited to this configuration. A reinforcing plate may be bonded to the opposite side of the first substrate 1 from the first joints 5, and a reinforcing plate may be bonded to the opposite side of the second substrate 2 from the second joints 6. Particularly, in the case where a reinforcing plate is provided on the opposite side of the first substrate 1 from the first joints 5 (the end 1a of the first substrate 1), it is possible to suppress a force restoring satisfactorily, with the restoring force F, the bent piece 2a where the second joints 6 of the second substrate 2 are formed.

In the foregoing embodiment, the substrates are joined with solder. The present invention is not limited to joining with solder and the substrates may be joined by brazing using a material other than solder.

The junction structure and the joining method of the substrates according to the present embodiment make it possible to stably join the substrates. Thus the junction structure and the joining method of the substrates according to the present embodiment are applicable to various kinds of electrical equipment including an optical pickup and a printer.

What is claimed is:

1. A junction structure of substrates, comprising:
a first substrate having a first joint formed on its end, and
a second substrate having a bending portion and a second joint,
wherein the bending portion of the second substrate exerts an elastic force in a direction that restores the bending portion to be flat,
said end of the first substrate resists the elastic force, and
the first joint and second joint are joined with a joining material.

2. The junction structure of the substrates according to claim 1, further comprising a first holding member for holding the first substrate, and a second holding member for holding a part containing the second joint on the second substrate,
wherein the first holding member is in contact with the first substrate in regions other than the first joint on a back side of the first substrate, and
the second holding member is in contact with the second substrate in regions other than the second joint on a back side of the second substrate.

3. The junction structure of the substrates according to claim 1, wherein an angle between the first substrate and a part where the second joint is formed on the second substrate is an obtuse angle.

4. A junction structure of substrates, comprising:
a first substrate having a first joint formed on its end, and
a second substrate having elasticity and having a bending portion and a second joint, the second joint facing outwardly
wherein the bending portion of the second substrate exerts an elastic force,
the first joint and the second joint are joined with solder, and
said end of the first substrate is in contact with the second joint of the second substrate in a direction that increases a bending angle of the bending portion.

5. The junction structure of the substrates according to claim 4, further comprising a first holding member for holding the first substrate, and a second holding member for holding the part containing the second joint on the second substrate,
wherein the first holding member is in contact with the first substrate in regions other than the first joint on a back side of the first substrate, and
the second holding member is in contact with the second substrate in regions other than the second joint on a back side of the second substrate.

6. The junction structure of the substrates according to claim 4, wherein an angle between the first substrate and the part where the second joint is formed on the second substrate is an obtuse angle.

7. The junction structure of the substrates according to claim 4, wherein said end where the first joint is formed on the first substrate has an end face formed into a straight lines shape.

8. The junction structure of the substrates according to claim 4, wherein the first substrate is a substrate having elasticity.

9. A junction structure of substrates, comprising:
a first substrate having a first joint formed on its end, and
a second substrate having a bending portion and a second joint,
wherein the bending portion of the second substrate exerts an elastic force in a direction that restores the bending portion to be flat,
said end of the first substrate resists the elastic force,
the first joint and second joint are joined with a joining material, and
an angle between the first substrate and a part where the second joint is formed on the second substrate is an obtuse angle.

10. A junction structure of substrates, comprising:
a first substrate having a first joint formed on its end, and
a second substrate having elasticity and having a bending portion and a second joint, the second joint facing outwardly
wherein the bending portion of the second substrate exerts an elastic force,
the first joint and the second joint are joined with solder,
said end of the first substrate is in contact with the second joint of the second substrate in a direction that increases a bending angle of the bending portion, and
an angle between the first substrate and a part where the second joint is formed on the second substrate is an obtuse angle.

* * * * *